(12) United States Patent
Beckhart et al.

(10) Patent No.: US 6,307,211 B1
(45) Date of Patent: Oct. 23, 2001

(54) SEMICONDUCTOR ALIGNMENT TOOL

(75) Inventors: Gordon Haggott Beckhart, Colorado Springs; Patrick Rooney Conarro, Cascade; Kevin James Harrell, Woodland Park; Michael Charles Krause; Kamran Michael Farivar-Sadri, both of Colorado Springs, all of CO (US)

(73) Assignee: MicroTool, Inc., Colorado Springs, CO (US)

( * ) Notice: Subject to any disclaimer, the term of this patent is extended or adjusted under 35 U.S.C. 154(b) by 0 days.

(21) Appl. No.: 09/411,350

(22) Filed: Oct. 1, 1999

Related U.S. Application Data

(63) Continuation-in-part of application No. 09/346,867, filed on Jul. 2, 1999.
(60) Provisional application No. 60/127,895, filed on Apr. 5, 1999, and provisional application No. 60/113,020, filed on Dec. 21, 1998.

(51) Int. Cl.[7] .................................................. G01B 11/00
(52) U.S. Cl. ........................................ 250/559.33; 356/400
(58) Field of Search .......................... 250/559.29, 559.3, 250/559.33, 559.36, 559.37, 559.38, 559.4, 223 R; 356/399–401; 414/222.02, 744.6, 935–941; 118/712, 713; 700/213, 218, 228; 33/533, 645

(56) References Cited

U.S. PATENT DOCUMENTS

| | | | | |
|---|---|---|---|---|
| 5,225,691 | * | 7/1993 | Powers et al. | 250/559.4 |
| 5,454,170 | * | 10/1995 | Cook | 33/645 |
| 6,063,196 | * | 5/2000 | Li et al. | 118/712 |
| 6,126,380 | * | 10/2000 | Hillman | 414/744.6 |
| 6,178,361 | * | 1/2001 | George et al. | 700/213 |

\* cited by examiner

*Primary Examiner*—John R. Lee
(74) *Attorney, Agent, or Firm*—Dale B. Halling

(57) ABSTRACT

A semiconductor alignment tool has a housing that has a number of registration pins for mating with a standard semiconductor cassette. A plurality of x-y axis sensors are embedded in a first surface of the housing.

17 Claims, 9 Drawing Sheets

*120*

| | 2 Uncovered<br>3 Uncovered | 2 Uncovered<br>3 Covered | 2 Covered<br>3 Covered | 2 Covered<br>3 Uncovered |
|---|---|---|---|---|
| 4 Uncovered<br>5 Uncovered | *122*  | *124*  | *126*  |  |
| 4 Uncovered<br>5 Covered |  |  |  |  |
| 4 Covered<br>5 Covered |  |  |  |  |
| 4 Covered<br>5 Uncovered |  |  |  |  |

SEMICONDUCTOR ALIGNMENT TOOL

RELATED APPLICATIONS

The present application is a continuation in part of the U.S. patent application filed on Jul. 2, 1999, Entitled "Tool for Aligning a Robot Arm to a cassette for Holding Semiconductor Wafers", Ser. No. 09/346,867, which has been allowed and claims priority on provisional patent application 60/127,895 filed on Apr. 5, 1999 and on provisional patent application 60/113,020 filed on Dec. 21, 1998.

RELATED APPLICATIONS

The present patent is a continuation-in-part of the patent application entitled "Tool for Aligning a Robot Arm to a Cassette for Holding Semiconductor Wafers", filed on Jul. 2, 1999, Ser. No. 09/346,867, having common inventors as the present application and assigned to the same assignee as the present application.

FIELD OF THE INVENTION

The present invention relates generally to the field of semiconductor wafer manufacturing and more particularly to a semiconductor alignment tool.

BACKGROUND OF THE INVENTION

Semiconductor wafers are moved into and out of cassettes by automated handling devices (robots) as part of the semiconductor manufacturing process. The cassettes hold the wafers while other wafers are being processed. The automated handling devices require a setup procedure to properly pick up wafers and to properly set wafers in the count position. The setup procedure typically involves visually determining count robot positions and recording these coordinates. A number of problems can occur when automated handlers and platforms are not properly setup. In the most severe case automated handlers can break wafers. Less severe misalignments can lead to wafer scratching and yield loss. The most common misalignment leads to wafers bumping into the cassette walls and scraping off particles.

Visual or eyeball alignment does not align to a standard. In addition, eyeball alignments cannot address issues related to platform level, robot end effector level, or a dynamic path that the end effector may follow. Finally, eyeball alignments are difficult, time consuming, and inaccurate.

Thus there exists a need for a device that provides a standard robot setup procedure, is fast, easy, accurate and can address issues such as dynamic path concerns.

DETAILED DESCRIPTION OF THE DRAWINGS

The invention is a semiconductor alignment tool having a housing that has a number of registration pins for mating with a standard semiconductor cassette. A plurality of x-y axis sensors are embedded in a first surface of the housing. The x-y axis sensors sense an edge of a semiconductor wafer as it is placed in the standard semiconductor cassette. The sensor outputs are processed either at the tool or by software running on a computer. The software determines the direction the wafer needs to move in order to be correctly located. Once the semiconductor wafer is correctly located, the position information can be programmed into a robot. The tool provides a low cost method of aligning robots to semiconductor cassettes. The tool saves time and is more accurate than prior art methods.

Figure 1:
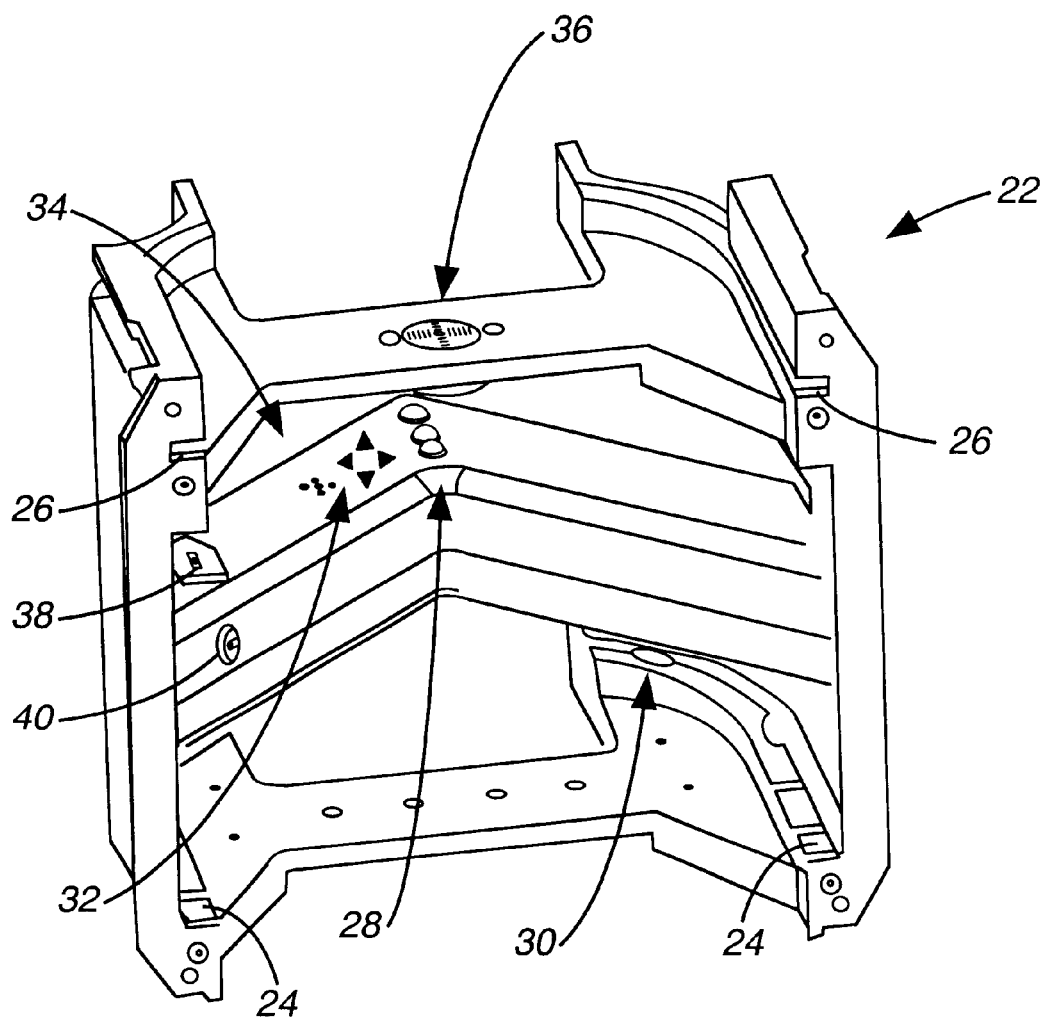
FIG. 1 is a top, left perspective view of a tool for aligning a robot arm to a cassette for holding semiconductor wafers in accordance with one embodiment of the invention.

FIG. 1 is a top, left perspective view of a tool 20 for aligning a robot arm to a cassette for holding semiconductor wafers in accordance with one embodiment of the invention. The tool 20 has a housing 22 that is similar to a semiconductor cassette. The housing 22 is made of metal in one embodiment and holds the required electronics. The housing 22 has a slot one position 24 and a slot twenty-five position 26. Once the robot has been calibrated to the slot one position 24 most robot models can then determine the other positions. Semiconductor cassettes have a standard spacing between slots, so the robot just needs to increment the z-axis to place a wafer in slot two or slot ten. Some robot models need to be calibrated to slot twenty-five in addition to slot one. The tool 20 includes a z-axis non-intrusive detector. The z-axis non-intrusive detector by SUNX model EX13B is suitable for this application. The z-axis non-intrusive detector, in one embodiment, has an optical transmitter and an optical detector aligned on the slot one position 24. When the semiconductor wafer is in the correct slot one position it breaks (reflects) the optical transmitter beam. This is detected by the optical detector. A z-axis indicator 28 indicates that the wafer is in the correct position. The z-axis indicator 28 is shown as an LED. In one embodiment the z-axis indicator has three LEDs, one for slot one, one for a lift position and one for slot twenty-five. The LEDs light (signal) when the semiconductor wafer is in the correct position. Some robots need to be calibrated to a lift position, which is the position the robot lifts from slot one to remove a semiconductor wafer from slot one. This requires a lift z-axis non-intrusive detector that is attached to the housing. The lift z-axis detector functions similarly to the slot one z-axis detector.

The housing 22 also contains an x-y detector system, one of the detectors 30 for the slot one position is shown. The x-y detector system will be described in more detail in conjunction with FIG. 5. In one embodiment, there is an x-y detector system for slot twenty-five 26. The x-y detector system is connected to an x-y indicator 32. The x-y indicator 32 includes four directional lights and a center light the turns on when the semiconductor wafer is correctly aligned along both an x-axis and a y-axis. A speaker 34 also makes an audible sound when the wafer is aligned along the z-axis.

Generally the first step in the alignment process is to replace a cassette with the tool 20. The operator checks to determine that the tool is level using the level 36. In one embodiment, the level is a bubble level. The operator turns on the tool 20 by flipping on a switch 38. The tool operates on rechargeable batteries and has an electrical jack 40 for recharging the batteries. The operator then manually moves the robot's arm that holds a semiconductor wafer into the slot one position. The x-y indicator points the direction that the semiconductor wafer needs to move. In one embodiment, the tool includes a communication link back to the robot and provides automatic feedback. This allows the robot to be calibrated (aligned) without a human operator. The z-axis indicator tells the operator when the wafer is in the correct vertical position. Once the wafer is properly aligned the robot memorizes the position. In one embodiment, the process is repeated for the lift position and slot twenty-five position. Note that the tool 20 is also used to check whether a previously aligned robot has become mis-aligned. Thus the tool provides a quick, accurate system for the setup and checking of robot arms in semiconductor manufacturing operations.

Figure 2:
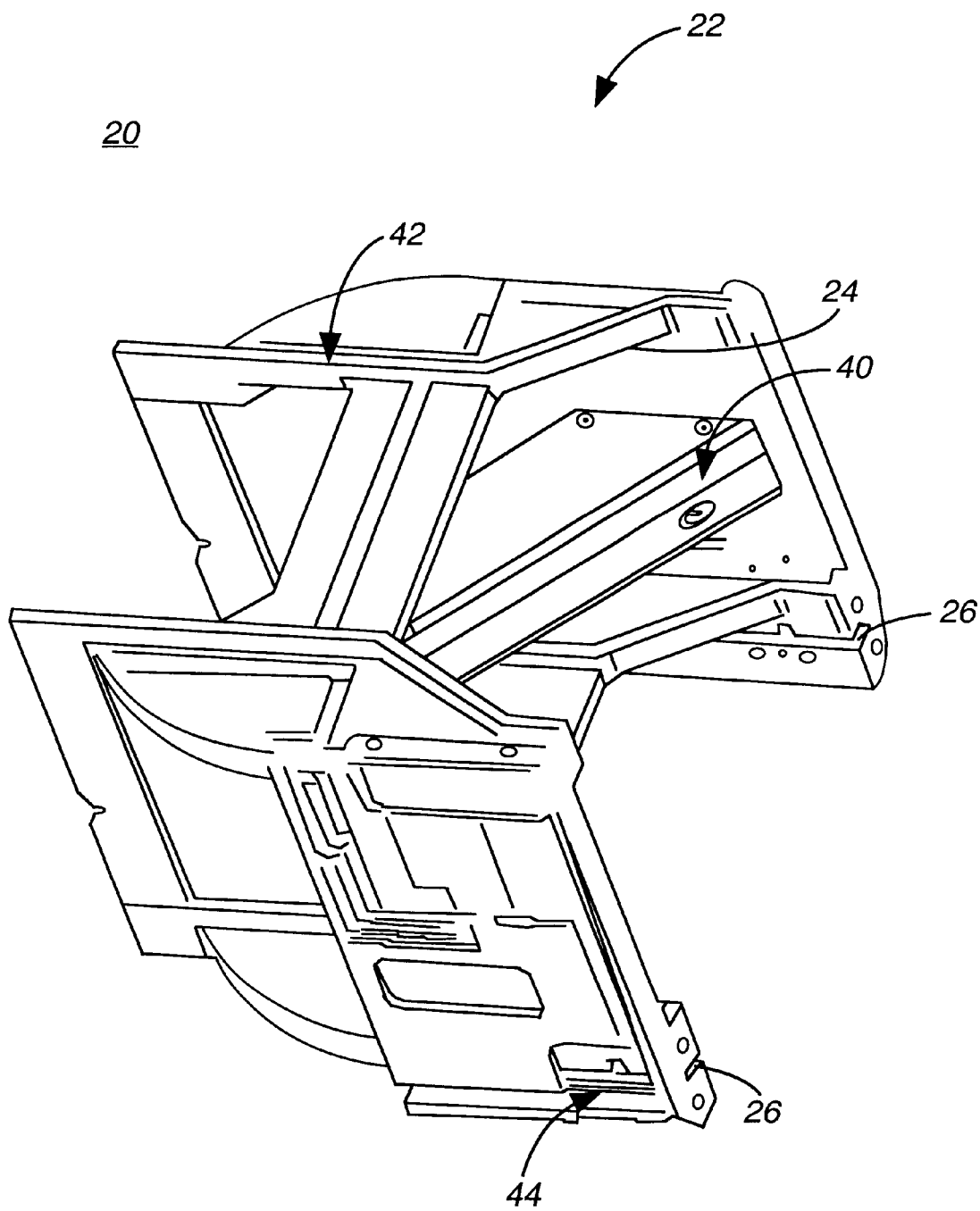
FIG. 2 is a ninety degree rotation, bottom, right perspective view of the tool of FIG. 1.

FIG. 2 is a ninety degree rotation, bottom, right perspective view of the tool 20 of FIG. 1. The tool housing 22 conforms to the SEMI (Semiconductor Equipment and Materials International) H-bar profile 42. SEMI is an international semiconductor equipment standards body. SEMI has propagated several standards for semiconductor cassettes. The housing 22 of the tool 20 conforms as much as possible to these standards. This allows the tool 20 to fit where ever a cassette can fit. The z-axis sensors 44 are adjustable.

Figure 3:
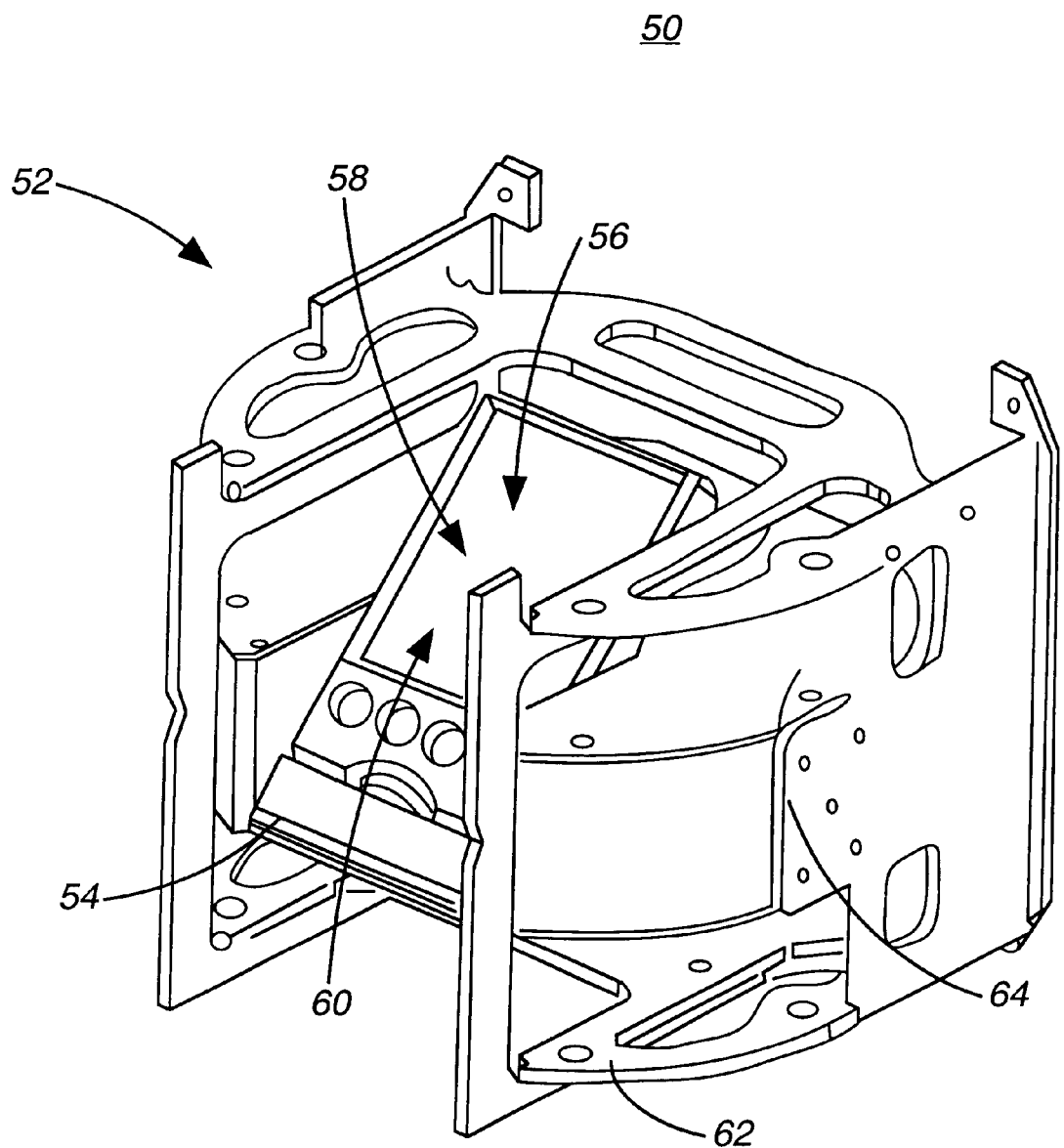
FIG. 3 is a top, right perspective view of a tool for aligning robot arm to a cassette for holding semiconductor wafers in accordance with one embodiment of the invention.

FIG. 3 is a top, right perspective view of a tool 50 for aligning a robot arm to a cassette for holding semiconductor wafers in accordance with one embodiment of the invention. The housing 52 of the tool 50 has a slot 54 for holding a handheld computer 56. The handheld computer 56 has a display 58 for z-axis, x-axis rotation and y-axis rotation. A display 60 shows the x-axis and y-axis alignment. The handheld computer provides the operator with more flexibility and power. Like the tool 20 in FIGS. 1 & 2 the housing has a slot one position 62 and a slot twenty-five position 64. The tool 50 includes x-y axis sensors and z-axis sensors. In addition, the z-axis sensors (z-axis sensor system) are able to detect tilt in the wafer. The sensor systems will be described in more detail with respect to FIGS. 5 & 8–10. In one embodiment, the sensor information is processed and commands are sent to the robot to automatically align the robot. In one embodiment the commands are sent over a wire. In another embodiment, a wireless communication connection (transmission system) is used to send the commands.

Figure 4:
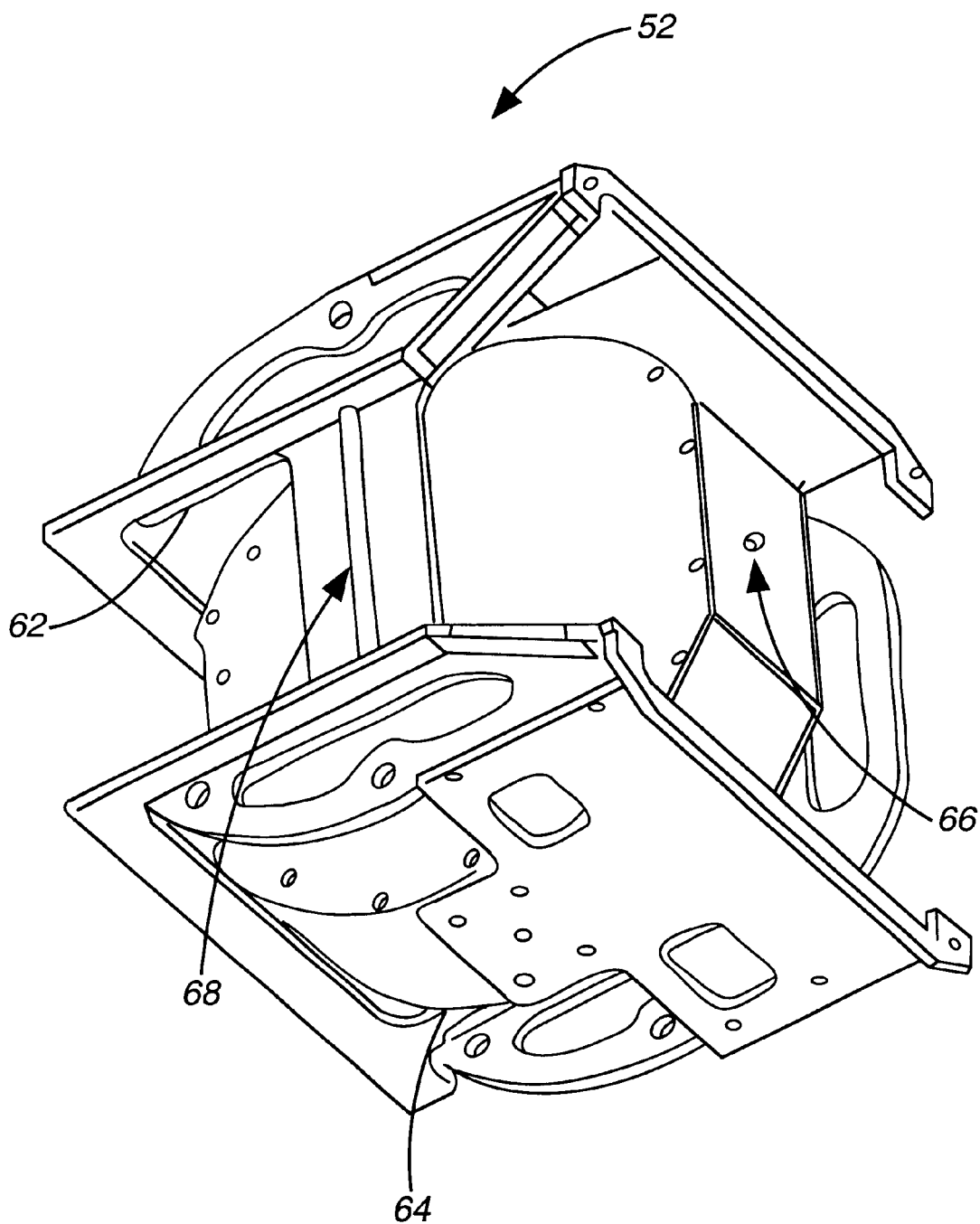
FIG. 4 is a bottom right perspective view of the tool of FIG. 3.

FIG. 4 is a bottom right perspective view of the tool 50 of FIG. 3. This view shows the charging jack 66 for the batteries and the SEMI H-bar standard design 68. The housing design is determined by the need to fit within the spaces used by the semiconductor cassettes and the need to house the sensors and the handheld computer. As will be apparent to those skilled in the art many housing designs are possible.

Figure 5:
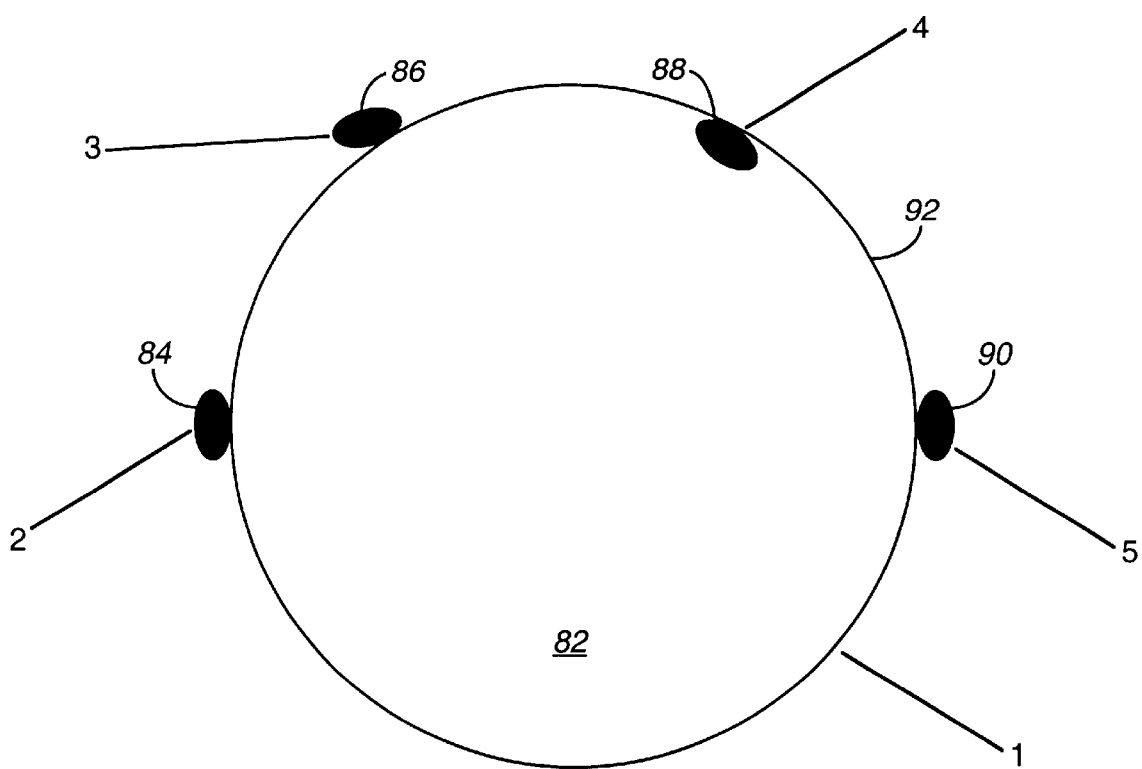
FIG. 5 is a schematic diagram of an x-y axis semiconductor wafer detection system in accordance with one embodiment of the invention.

FIG. 5 is a schematic diagram of an x-y axis semiconductor wafer detection system in accordance with one embodiment of the invention. The semiconductor wafer (1) 82 is shown in conjunction with four x-y sensors (plurality of sensors) (2) 84, (3) 86, (4) 88, (5) 90. In one embodiment, the sensors 84, 86, 88, 90 transmit an optical signal and receive a reflection when the wafer 82 covers the sensor. The detectors (2) 84, (3) 86, (5) 90 are designed to be just outside the perimeter (ideal edge position) 92 of the wafer 82 when the wafer is properly aligned. The detector (4) 88 is designed to be covered when the wafer is properly aligned. Using this information the detection system is capable of determining which direction the wafer needs to move in order to be properly aligned along the x-axis and y-axis. The logical requirements for determining the direction are shown in FIG. 7.

Figure 6:
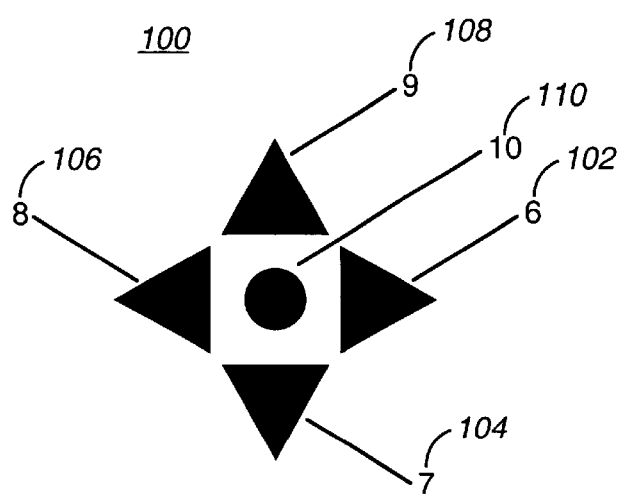
FIG. 6 is a schematic diagram of an x-y axis indicator in accordance with one embodiment of the invention.

FIG. 6 is a schematic diagram of an x-y axis indicator 100 in accordance with one embodiment of the invention. The x-y indicator 100 can be formed by using lights or can be displayed on a monitor or a screen. For clarity it will be assumed in the following discussion that the x-y indicator is formed of five lights (plurality of lights) (6) 102, (7) 104, (8) 106, (9) 108, (10) 110. The center light 110 is on when the semiconductor wafer is properly aligned (ideal position). The other lights 102, 104, 106, 108 form a pointing system indicating that the wafer needs to move in a direction. The x-y axis indicator system 100 receives a plurality of signals from the plurality of sensors of FIG. 5

Figure 7:
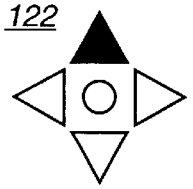
FIG. 7 is a requirements chart for an x-y indicator in accordance with one embodiment of the invention.
Figure 7:
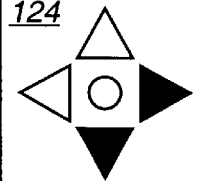
Figure 7:
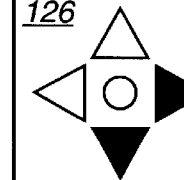
Figure 7:
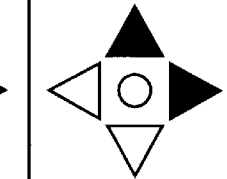
Figure 7:
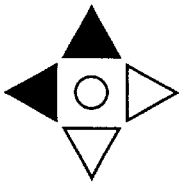
Figure 7:
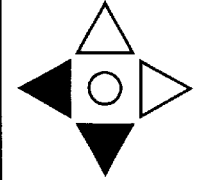
Figure 7:
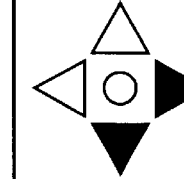
Figure 7:
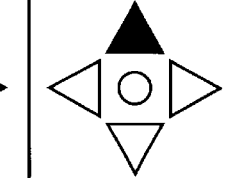
Figure 7:
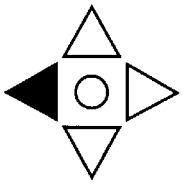
Figure 7:
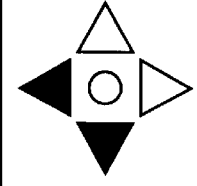
Figure 7:
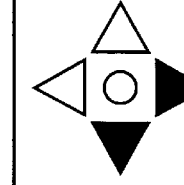
Figure 7:
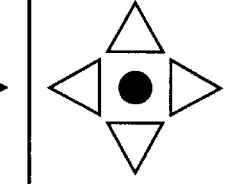
Figure 7:
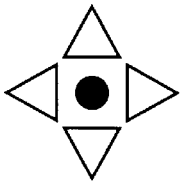
Figure 7:
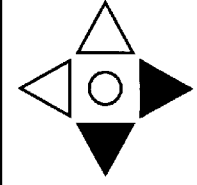
Figure 7:
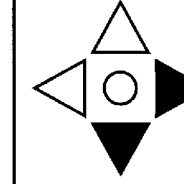
Figure 7:
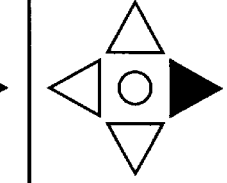

FIG. 7 is a requirements chart 120 for an x-y indicator in accordance with one embodiment of the invention. Box 122 shows that the forward light is on when all the sensors are uncovered. Box 124 shows that the right and back light are on when only sensor 3 is covered. Box 126 shows that the back and right light are on when sensors 2 & 3 are covered and sensor 4 & 5 are uncovered. The chart shows every possible combination of sensors being covered. As will be apparent to those skilled in the art a simple logic circuit is used to connect the sensors to the lights to achieve the requirements shown in the chart 120.

Figure 8:
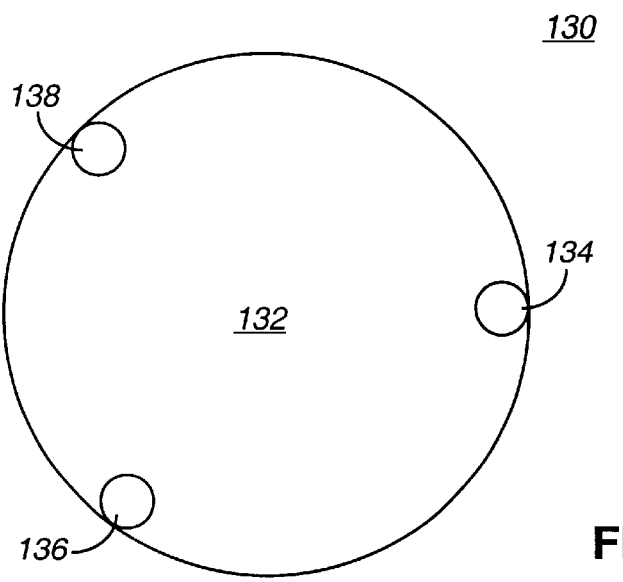
FIG. 8 is a top view z-axis detector system in accordance with one embodiment of the invention.

FIG. 8 is a top view z-axis detector system 130 in accordance with one embodiment of the invention. A semiconductor wafer 132 is shown with three z-axis detectors (plurality of distance sensors) 134, 136, 138. The z-axis detectors 134, 136, 138 each determine a distance to wafer. The z-axis detectors are made by SUNZ model FX11A in one embodiment.

Figure 9:
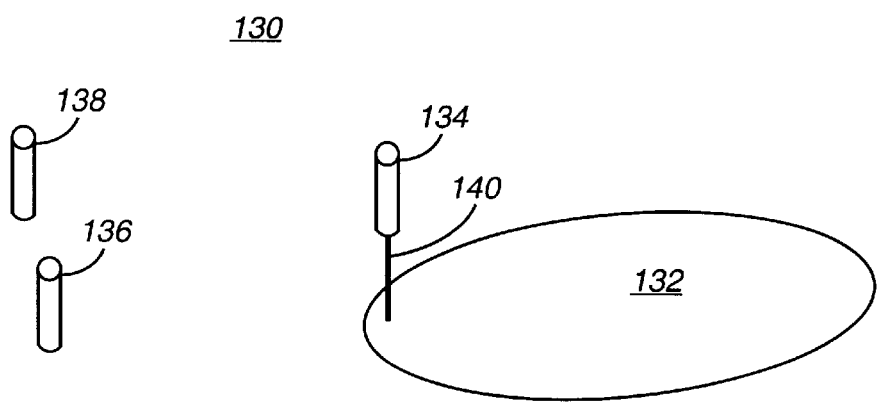
FIG. 9 is a perspective view of a z-axis detector system in accordance with one embodiment of the invention.
Figure 10:
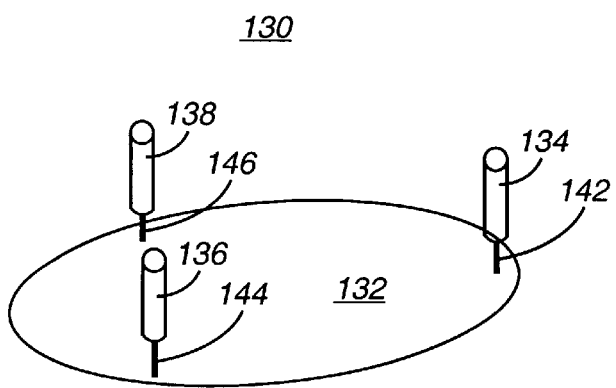
FIG. 10 is a perspective view of a z-axis detector system in accordance with one embodiment of the invention.

FIG. 9 is a perspective view of a z-axis detector system 130 in accordance with one embodiment of the invention. FIG. 10 is a perspective view of a z-axis detector system in accordance with one embodiment of the invention. As the wafer 132 enters the tool, a first measurement 140 is made. Once the wafer 132 is completely inserted into the tool a second measurement 142, third measurement 144 and a fourth measurement 146 are taken. An x-axis rotation (angular tilt) is determined by a first process that determines the difference between measurement 140 and measurement 142 and dividing by the horizontal distance of the wafer between the measurements 140, 142. An alarm can be set for the maximum amount of droop (x-axis rotation). When the maximum droop is exceeded an alarm will be triggered. A y-axis rotation is determined by a second process that determines the difference between the measurements (at least two measurements) 144, 146 and dividing by the distance between the measurements 144, 146. The operator generally adjusts the robot's arm until there is no y-axis rotation. Once the wafer is fully inserted the x-axis rotation is adjusted so that the x-axis rotation indicated by the comparison between measurement 142 and the average of the measurements 144, 146 is equal to the x-axis rotation initially measured by measurements 140, 142. The z-axis height is the average of the measurements 142, 144, 146 once the rotational adjustments have been made. Thus the z-axis detection system is capable of determining x and y axis rotation and z-axis height. This allows the tool to align rotation and adjust (detect) for excessive droop as the robot arm is in motion.

Figure 11:
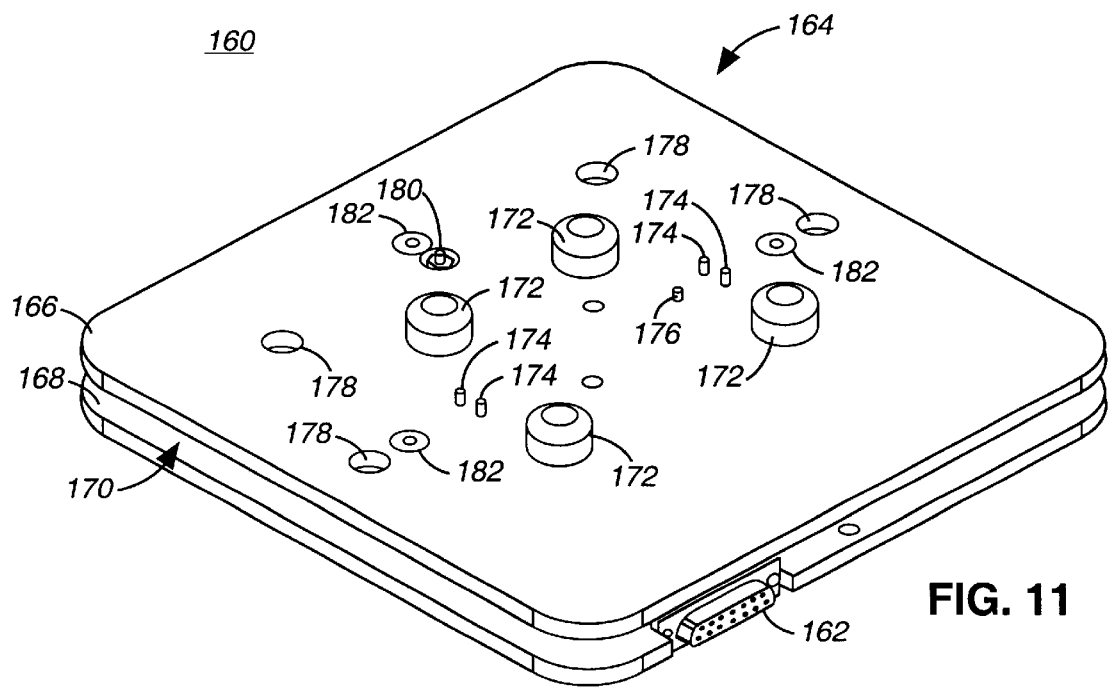
FIG. 11 is a top, left perspective view of a semiconductor alignment tool in accordance with one embodiment of the invention.

FIG. 11 is a top, left perspective view of a semiconductor alignment tool 160 in accordance with one embodiment of the invention. The tool shown in FIG. 11 differs from the tools shown in FIGS. 1–4 in that it is designed to be placed under a standard semiconductor cassette. As a result the tool 60 does not include a built in display. However a similar set of sensors are included in the tool and the process that the tool uses to determine the direction a semiconductor wafer needs to move is similar to those described in FIGS. 5–10. In one embodiment the tool 160 is connected to a computer through the I/O port (input/output, electrical connector) 162. The computer receives sensor data through the I/O port and calculates the position of the wafer and performs the display function shown in FIGS. 6 & 7. The tool 160 was a housing 1154. The housing includes a first substantially planer surface 166 and a second substantially planar surface 168. A gap 170 may exist between the two plates 166, 168. A first set of registration pins 172 are used for gross alignment of the semiconductor cassette on the first surface 166. A second set of registration pins 174 are used for fine alignment of the standard semiconductor cassette. The tool 160 also includes a cassette verification microswitch 176. A plurality of x-y axis sensors 178 are embedded in the first surface 166. A z-axis sensor 180 is also embedded in the first surface 166. In another embodiment, three (more than one) z-axis sensors 180 are used. The three z-axis sensors are placed in a triangular pattern. A plurality of screw holes (attachment provision) 182 are used to hold the housing to a semiconductor processing tool in one embodiment.

Figure 12:
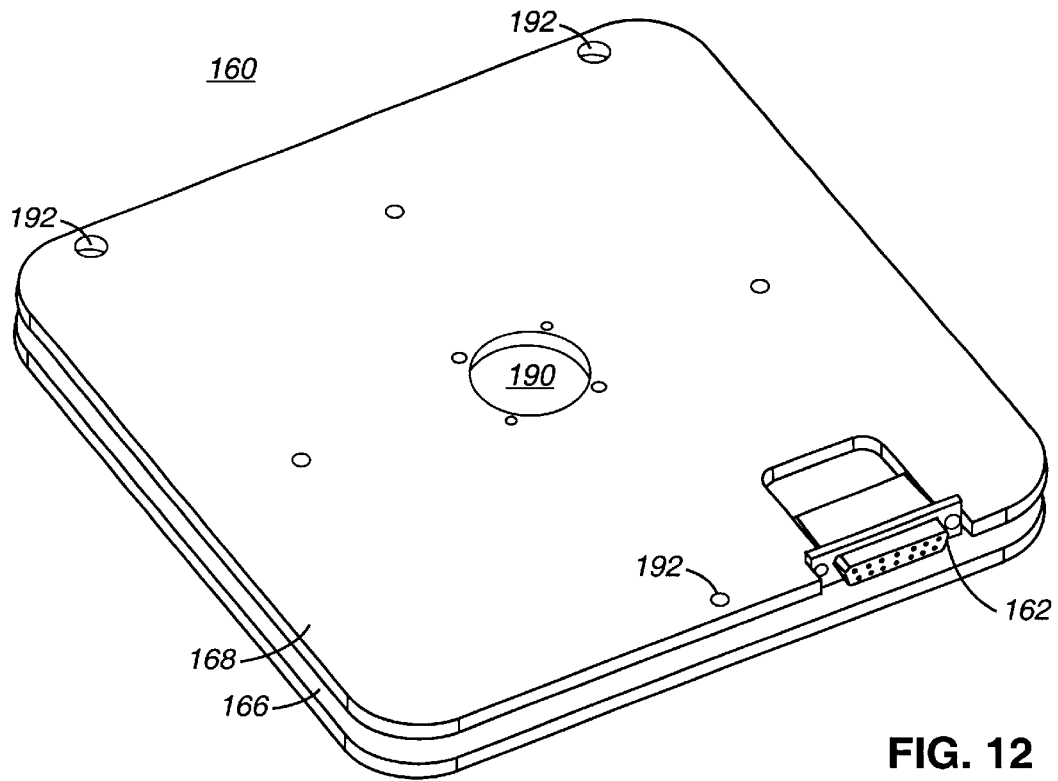
FIG. 12 is a bottom, left perspective view of a semiconductor alignment tool in accordance with one embodiment of the invention.

FIG. 12 is a bottom, left perspective view of a semiconductor alignment tool 160 in accordance with one embodiment of the invention. The bottom view shows a disk shaped void 190 in the second surface 168 of the housing. The void 190 is located where a standard mechanical interface for a semiconductor cassette door would be located. The platform 160 does not act as a door, but is compatible with semiconductor processing tools used with doors. Three registrations slots 192 are engaged by pins in the standard mechanical interface.

Figure 13:
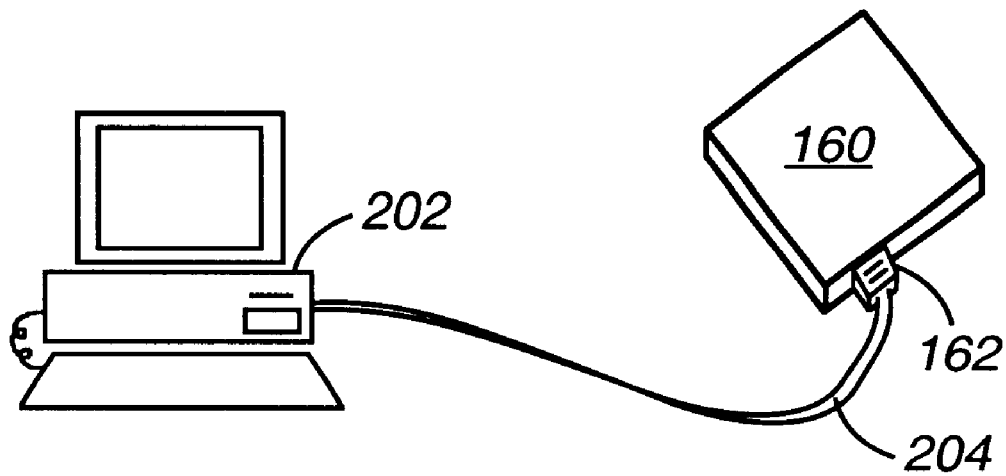
FIG. 13 is a schematic diagram of a semiconductor alignment tool and system in accordance with one embodiment of the invention.

FIG. 13 is a schematic diagram of a semiconductor alignment tool 160 and system 200 in accordance with one embodiment of the invention. The tool 160 is connected to a computer 202 by an electrical cable 204. The computer 202 receives sensor data from the tool 160 and calculates the position of a semiconductor wafer.

Thus there has been described a semiconductor alignment tool that is inexpensive, provides greater accuracy and is significantly easier to use than the prior art methods. While the invention has been described in conjunction with specific embodiments thereof, it is evident that many alterations, modifications, and variations will be apparent to those skilled in the art in light of the foregoing description. Accordingly, it is to embrace all such alterations, modifications, and variations in the appended claims.

What is claimed is:

1. A semiconductor alignment tool, comprising:
   a housing having a plurality of registration pins for mating with a standard semiconductor cassette; and
   a plurality of x-y axis sensors embedded in a first surface of the housing.

2. The tool of claim 1, further including an input-output port electrically connected to the plurality of x-y axis sensors.

3. The tool of claim 1, further including a z-axis sensor embedded in the first surface of the housing.

4. The tool of claim 1, further including an attachment provision to hold the housing to a semiconductor processing tool.

5. The tool of claim 1, further including a disk-shaped void on a second surface of the housing.

6. The tool of claim 1, wherein the plurality of registration pins include a first set of registration pins for gross alignment of the standard semiconductor cassette.

7. The tool of claim 1, wherein the plurality of registration pins include a second set of registration pins for fine alignment of the standard semiconductor cassette.

8. A semiconductor alignment tool, comprising:
   a housing having a first substantially planar surface and a second substantially planar surface, the first substantially planar surface having a surface area sufficient to hold a standard semiconductor cassette;
   a plurality of screw holes extending through the housing; and
   a z-axis sensor embedded in the first substantially planar surface.

9. The tool of claim 8, further including an electrical connector in electrical communication with the z-axis sensor.

10. The tool of claim 9, further including a computer connected to the electrical connector.

11. The tool of claim 10, wherein the computer determines a z-axis position of a semiconductor wafer from a z-axis sensor signal.

12. The tool of claim 8, further including a plurality of registration pins.

13. A semiconductor alignment tool, comprising:
   a platform having a plurality of registration pins capable of mating with a standard semiconductor cassette; and
   a sensor attached to the platform.

14. The tool of claim 13, further including an electrical connector attached to the platform and electrically connected to the sensor.

15. The tool of claim 13, further including a plurality of screw holes in the platform.

16. The tool of claim 13, wherein the sensor is a plurality of x-y axis sensors.

17. The tool of claim 13, wherein the sensor is a z-axis sensor.

* * * * *